(12) United States Patent
Huang et al.

(10) Patent No.: US 9,397,116 B2
(45) Date of Patent: Jul. 19, 2016

(54) SEMICONDUCTOR DEVICE HAVING A CLOSED CAVITY STRUCTURE AND METHOD OF MANUFACTURING THE SAME

(71) Applicant: Semiconductor Manufacturing International (Shanghai) Corporation, Shanghai (CN)

(72) Inventors: Herb He Huang, Shanghai (CN); Clifford I. Drowley, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 46 days.

(21) Appl. No.: 14/444,045

(22) Filed: Jul. 28, 2014

(65) Prior Publication Data
US 2015/0187793 A1    Jul. 2, 2015

(30) Foreign Application Priority Data
Dec. 27, 2013    (CN) .......................... 2013 1 0743156

(51) Int. Cl.
*H01L 27/12* (2006.01)
*H01L 21/84* (2006.01)

(52) U.S. Cl.
CPC ............ *H01L 27/1203* (2013.01); *H01L 21/84* (2013.01)

(58) Field of Classification Search
CPC .... H01L 27/1203; H01L 21/84; H01L 21/764
See application file for complete search history.

(56) References Cited

U.S. PATENT DOCUMENTS

| | | | | |
|---|---|---|---|---|
| 2008/0029829 A1* | 2/2008 | Yang | ................. | H01L 21/26506 257/402 |
| 2008/0265323 A1* | 10/2008 | Miyairi | ............... | H01L 27/1214 257/347 |
| 2011/0108942 A1* | 5/2011 | Fenouillet-Beranger | | H01L 21/76283 257/503 |

* cited by examiner

*Primary Examiner* — Tucker J Wright
(74) *Attorney, Agent, or Firm* — Innovation Counsel LLP

(57) ABSTRACT

A semiconductor device may include a first dielectric layer. The semiconductor device may further include a second dielectric layer overlapping the first dielectric layer and having a closed cavity structure. The semiconductor device may further include a first transistor disposed between the first dielectric layer and the closed cavity structure. The semiconductor device may further include a second transistor disposed between the first dielectric layer and the closed cavity structure. The semiconductor device may further include a trench isolation structure disposed between the first transistor and the second transistor and disposed between the first dielectric layer and the closed cavity structure.

16 Claims, 10 Drawing Sheets

S101 Provide a composite semiconductor substrate, which may include a first semiconductor substrate, an embedded insulating layer, and a second semiconductor substrate. Form STI structures and first-type transistors in the first semiconductor substrate.

S102 Form a first dielectric layer on a first surface of the first semiconductor substrate. Form first-type vertical connectors (connected to the sources, drains, gates of the first-type transistors) in the first dielectric layer. Form first-type horizontal connectors (connected to the first-type vertical connectors) on a first surface of the first dielectric layer.

S103 Join the first dielectric layer and/or the first semiconductor substrate with a carrier substrate. Remove the second semiconductor substrate.

S104 Form an island-shaped sacrificial layer on a second surface of the first semiconductor substrate. Form a second dielectric layer that covers the sacrificial layer. A portion of the second dielectric layer may contact a surface of the sacrificial layer.

S105 Form micro-channels that penetrate the portion of the second dielectric layer. Remove material of the sacrificial layer through the micro-channels, such that a cavity may be formed. Form a third dielectric layer on the second dielectric layer to seal the micro-channels, thereby closing the cavity to form a closed cavity.

S106 Form second-type vertical connectors. The second-type vertical connectors may pass through the third dielectric layer, the second dielectric layer, the embedded insulating layer, the first semiconductor substrate, and the first dielectric layer. The second-type vertical connectors may be connected to the first-type horizontal connectors.

Fig. 3

SEMICONDUCTOR DEVICE HAVING A CLOSED CAVITY STRUCTURE AND METHOD OF MANUFACTURING THE SAME

CROSS-REFERENCE TO RELATED APPLICATION

This application claims priority to and benefit of Chinese Patent Application No. 201310743156.4, filed on Dec. 27, 2013, the Chinese Patent Application being incorporated herein by reference in its entirety.

BACKGROUND OF THE INVENTION

The present invention is related to a semiconductor device, a method for manufacturing the semiconductor device, and an electronic device that includes the semiconductor device.

An electronic device, such as a wireless communication device (e.g., a mobile phone or a tablet computer), may include a radio-frequency (RF) front-end module (FEM). An RF FEM may include an RF switch device, which may include an integrated circuit or may be part of an integrated circuit. Presently, an RF switch device may include a silicon-on-insulator (SOI) metal-oxide-semiconductor field-effect transistor (MOSFET).

In an RF switch device that includes a SOI MOSFET, parasitic coupling effects may exist between some of a source electrode (or source), a drain electrode (or drain), a gate electrode (or gate), an interconnection line, and a semiconductor substrate, such that parasitic capacitance may be generated. The parasitic capacitance may vary according to voltage variation of switch signals. As a result, the performance of the SOI MOSFET, the RF switch, the RF FEM, and/or the electronic device may be undesirably affected.

SUMMARY

An embodiment of the present invention may be related to a semiconductor device that may include a first dielectric layer. The semiconductor device may further include a second dielectric layer overlapping the first dielectric layer and having a closed cavity structure. The semiconductor device may further include a first transistor disposed between the first dielectric layer and the closed cavity structure. The semiconductor device may further include a second transistor disposed between the first dielectric layer and the closed cavity structure. The semiconductor device may further include a trench isolation structure disposed between the first transistor and the second transistor and disposed between the first dielectric layer and the closed cavity structure.

The semiconductor device may include an embedded insulating layer disposed between the first transistor and the closed cavity structure.

The semiconductor device may include a dielectric member formed of a first dielectric material. The second dielectric layer may include a channel structure. The dielectric member may be disposed inside the channel structure.

The second dielectric layer may be formed of the first dielectric material.

The second dielectric layer may be formed of a second dielectric material different from the first dielectric material.

The semiconductor device may include a third dielectric layer disposed on the second dielectric layer. The dielectric member may be disposed between the third dielectric layer and the closed cavity structure.

The third dielectric layer may be formed of the first dielectric material.

A space inside the closed cavity structure may be substantially vacuum.

The semiconductor device may include a gas disposed inside the closed cavity structure.

The semiconductor device may include a semiconductor substrate disposed between the first dielectric layer and the second dielectric layer. The trench isolation structure, a source and a drain of the first transistor, and/or a source and a drain of the second transistor may be disposed inside the semiconductor substrate.

The semiconductor substrate may be a monocrystalline silicon substrate.

The first transistor may be a metal-oxide-semiconductor field-effect transistor and/or may be a depletion-mode transistor.

A gate of the first transistor and a gate of the second transistor may be embedded in the first dielectric layer.

The semiconductor device may include the following elements: a first connector extending in a first direction and being electrically connected to at least one of a source, a drain, and a gate of the first transistor; a second connector extending substantially parallel to the first connector and passing through the first dielectric layer and the second dielectric layer; and a third connector electrically extending in a second direction different from the first direction and being connected to both the first connector and the second connector.

The semiconductor device may include a semiconductor substrate disposed between the first dielectric layer and the second dielectric layer. The semiconductor device may further include a trench dielectric element disposed the semiconductor substrate. The trench isolation structure, a portion of the first transistor, and a portion of the second transistor may be disposed in the semiconductor substrate. The second connector may be surrounded by the trench dielectric element.

At least one of the first connector and the second connector may be formed of at least one of tungsten, copper, and a semiconductor that includes silicon.

An embodiment of the invention may be related to an electronic device that includes a semiconductor device that includes one or more of the aforementioned elements. The electronic device may further include an electronic component that is electrically connected to the semiconductor device.

An embodiment of the invention may be related to a method for manufacturing a semiconductor device. The method may include the following steps: forming elements (e.g., a source and a drain) of a first transistor, elements (e.g., a source and a drain) of a second transistor, and a trench isolation structure in a first substrate; forming a first dielectric layer on a first side of the first substrate; forming a sacrificial layer on a second side of the first substrate, the sacrificial layer partially covering the second side of the first substrate, the sacrificial layer overlapping at least one of the elements of the first transistor and the elements of the second transistor, a first surface of the sacrificial layer being disposed between the first substrate and a second surface of the sacrificial layer; forming a second dielectric layer on the sacrificial layer, a portion of the second dielectric layer contacting the second surface of the sacrificial layer; forming a channel that passes through the portion of the second dielectric layer; removing material of the sacrificial layer through the channel to form a cavity structure; and sealing the channel to close the cavity structure, such that a closed cavity structure may be formed.

The method may include the following steps: providing a composite substrate that includes the first substrate and a second substrate; and removing the second substrate before the step of forming the sacrificial layer.

The method may include the following steps: implanting first-type dopants through the first side of the first substrate; forming a gate of the first transistor and a gate of the second transistor on the first side of the first substrate; implanting second-type dopants through the first side of the first substrate; and heat-treating the first substrate to activate the first-type dopants and the second-type dopants for forming the elements of the first transistor and the elements of the second transistor.

According to embodiments of the invention, transistors of a semiconductor may be effectively insulated and/or isolated from each other such that unwanted coupling effects may be prevented or substantially minimized. As a result, unwanted parasitic capacitance may be prevented or substantially minimized. Advantageously, quality and performance of the semiconductor device and/or a related electronic device may be satisfactory.

The above summary is related to one or more of many embodiments of the invention disclosed herein and is not intended to limit the scope of the invention.

BRIEF DESCRIPTION OF THE DRAWINGS

FIG. 3 shows a flowchart illustrating a method for manufacturing a semiconductor device in accordance an embodiment of the present invention.

DETAILED DESCRIPTION

Figure 1:
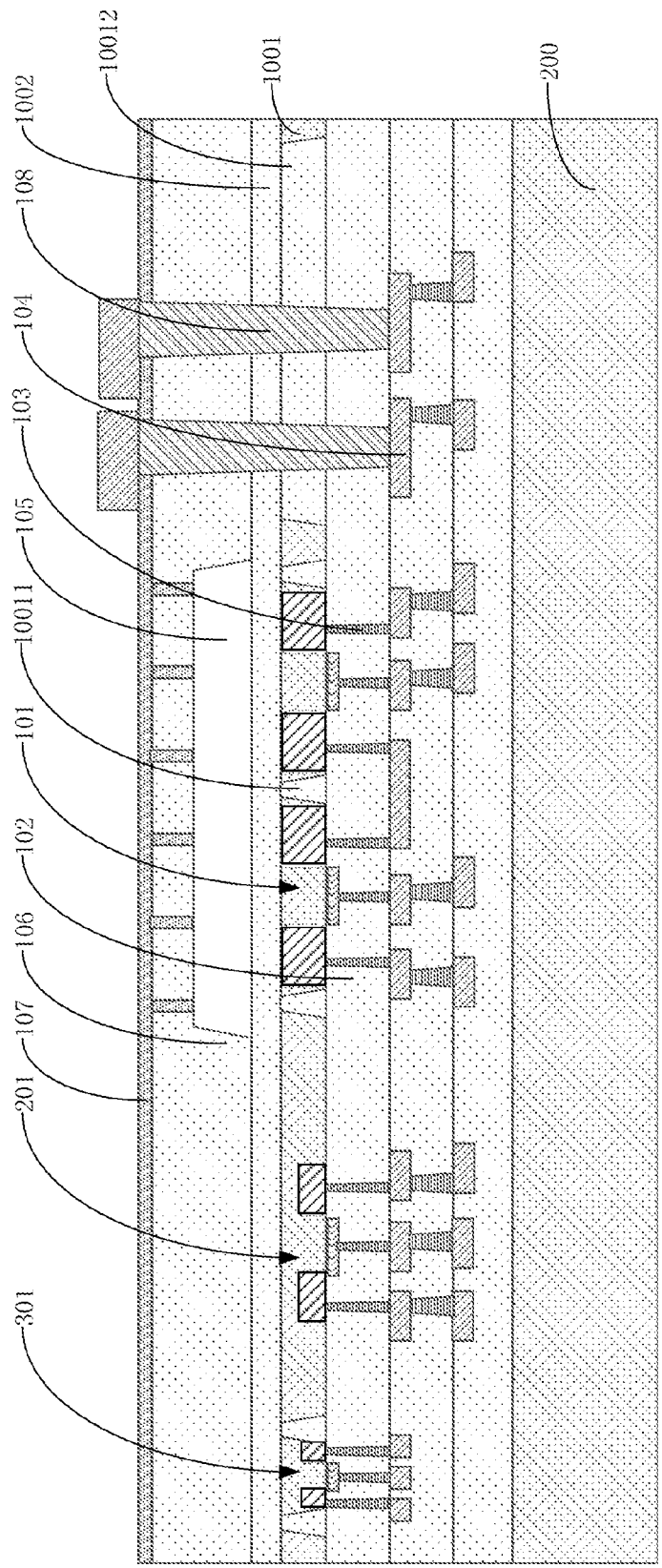
FIG. 1 shows a schematic cross-sectional view illustrating a structure of a semiconductor device in accordance with an embodiment of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic cross-sectional view illustrating a structure of a semiconductor device in accordance with an embodiment of the present invention.

As illustrated in FIG. 1, the semiconductor device may include one or more of the following elements and/or structures: a first semiconductor substrate 1001, a set of first-type transistors 101, a set of second-type transistors 201, a set of third-type transistors 301, a set of shallow trench insulation (STI) structures 10011, a first dielectric layer 102, a second dielectric layer 106, a third dielectric layer 107, an embedded insulating layer 1002, a closed cavity 105 (e.g., a substantially vacuum cavity 105), a set of first-type vertical interconnect/connectors 103 (which may be conductors or semiconductors), a set of second-type vertical interconnect/connectors 108 (which may be conductors or semiconductors), a set of first-type horizontal interconnect/connectors 104 (which may be conductors or semiconductors), a horizontal STI dielectric layer 10012, and a carrier substrate 200.

The first-type transistors 101 may be positioned in the first semiconductor substrate 1001. Inside the first semiconductor substrate 1001, a first portion of a first first-type transistor 101 may be insulated from a first portion of a second first-type transistor 101 by a STI structure 10011. On a first side (e.g., lower side according to FIG. 1) of the first semiconductor substrate 1001, a second portion of the first first-type transistor 101 may be insulated from a second portion of the second first-type transistor 101 by the first dielectric layer 102. On a second side (e.g., upper side according to FIG. 1) of the first semiconductor substrate 1001, a third portion of the first first-type transistor 101 may be insulated from a third portion of the second first-type transistor 101 by the closed cavity 105. The first portion of the first first-type transistor 101 may be disposed between the second portion of the first first-type transistor 101 and the third portion of the first first-type transistor 101.

A first-type vertical connector 103 may connect one or more of electrodes (e.g., a source electrode, a drain electrode, and/or a gate electrode) of a first-type transistor 101 to other components of the semiconductor device. The electrodes of the first-type transistor 101 may be insulated by the first dielectric layer 102.

A second-type vertical connector 108 may pass through the first dielectric layer 102, the first semiconductor substrate 1001, the second dielectric layer 106, and the third dielectric layer 107. In an embodiment, the semiconductor device may include the embedded insulating layer 1002, and the second-type vertical connector 108 may pass through the embedded insulating layer 1002. The second-type vertical connector 108 may provide electrical connection between components of the semiconductor device.

A first-type horizontal connector 104 may connect different vertical connectors. In an embodiment, a first-type horizontal connector 104 may connect a first-type vertical connector 103 with a second-type vertical connector 108.

In an embodiment, a bottom portion of a first-type transistor 101 may be the portion of the first-type transistor 101 wherein a gate exists, and a top portion of the first-type transistor 101 may be opposite to the bottom portion.

Lateral sides of the closed cavity 105 may be defined and/or surrounded by the second dielectric layer. A top portion of the closed cavity 105 may be defined and/or covered by the second dielectric layer 106 and/or the third dielectric layer 107. A bottom portion of the closed cavity 105 may be defined and/or covered by the embedded insulating layer 1002, which may be disposed on the second side of the first semiconductor substrate 1001. In an embodiment, the embedded insulating layer 1002 may be omitted, and the bottom portion of the closed cavity 105 may be defined and/or covered by the second side of the first semiconductor substrate 1001. In an embodiment, the bottom portion of the closed cavity 105 may be defined and/or covered by a portion of the second dielectric layer 106.

A (maximum) height of the closed cavity 105 may be in a range of 100 nm to 4 μm. In an embodiment, a (maximum) height of the closed cavity 105 may be in a range of 1 μm to 2 μm.

The space inside the closed cavity 105 may be vacuum or substantially vacuum. In an embodiment, the closed cavity 105 may be filled with a predetermined gas.

One or more of the first dielectric layer 102, the second dielectric 106, and the third dielectric layer 107 may be made of one or more of silicon oxide ($SiO_2$), fluorosilicate glass (FSG), high-density-plasma oxide (HDP oxide), and a low-k dielectric material.

The embedded insulating layer 1002 may be made of an oxide and/or at least another suitable material.

The first semiconductor substrate 1001 may be made of silicon (Si, e.g., monocrystalline silicon) and/or glass.

A first-type transistor 101 may be a metal-oxide-semiconductor field-effect transistor (MOSFET). In an embodiment, a first-type transistor 101 may be a depletion-mode MOSFET. In an embodiment, first-type transistors 101 may be embedded inside the first dielectric layer 102.

One or more lateral sides of a second-type vertical connector 108 may be insulated and/or surrounded by the first dielectric layer 102, the horizontal STI dielectric layer 10012 (which is disposed inside the first semiconductor substrate 100), the second dielectric layer 106, and the third dielectric layer 107.

A first-type vertical connector 103 may be made of a semiconductor material that contains silicon (Si) and/or may be made of tungsten (W).

A second-type vertical connector 108 may be made of a semiconductor material that contains silicon (Si), may be made of tungsten (W), and/or may be made of copper (Cu).

The second dielectric layer 106 and the third dielectric layer 107 may be made of the same material, for ensuring that the closed cavity is satisfactorily sealed.

The semiconductor device may represent a radio-frequency (RF) switch device. In an embodiment, the semiconductor device may be an RF front-end module (FEM) that includes an RF switch device, and the first-type transistors 101 may represent transistors in the RF switch.

The semiconductor device may include a second-type transistor 201 and a third-type transistor 301. The semiconductor device may include one or more components, such as a microelectro-mechanical systems (MEMS) device and/or an integrated passive device (IPD), not illustrated in FIG. 1. One or more of the transistors and/or other components of the semiconductor device may include elements and/or structures that are known in the art.

According to embodiments of the invention, the STI structures 10011 may effectively insulate the first-type transistors 101 from each other. The first dielectric layer 102 may effectively insulate a first side of each first-type transistor 101. The closed cavity 105 may effectively insulate a second side (opposite the first side) of each first-type transistor 101. Therefore, each first-type transistor 101 may be effectively insulated, such that substrate coupling effects may be minimized or substantially prevented. As a result, signal loss and/or distortion may be minimized or substantially prevented. Advantageously, the quality and/or performance of the semiconductor device may be satisfactory.

FIG. 2A, FIG. 2B, FIG. 2C, FIG. 2D, FIG. 2E, FIG. 2F, FIG. 2G, and FIG. 2H show schematic cross-sectional views illustrating structures formed during manufacturing of a semiconductor device using a method in accordance with an embodiment of the present invention.

Figure 2A:
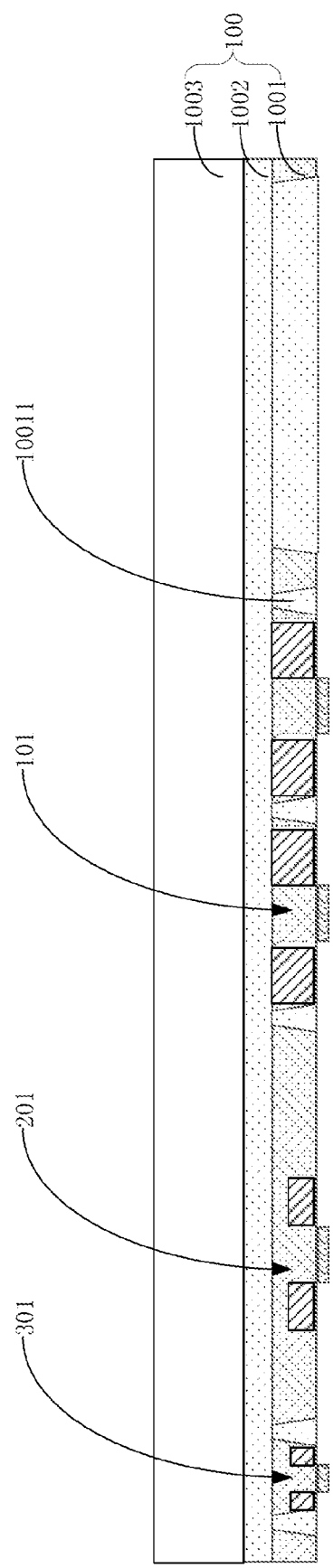
FIG. 2A, FIG. 2B, FIG. 2C, FIG. 2D, FIG. 2E, FIG. 2F, FIG. 2G, and FIG. 2H show schematic cross-sectional views illustrating structures formed during manufacturing of a semiconductor device in accordance with an embodiment of the present invention.

Referring to FIG. 2A, a composite semiconductor substrate 100 may be provided. The composite semiconductor substrate 100 may include a first semiconductor substrate 1001, an embedded insulating layer 1002 disposed on the first semiconductor substrate 1001, and a second semiconductor substrate 1003 disposed on the embedded insulating layer 1002, such that the layer 1002 is disposed between the substrate 1001 and the substrate 1003. Shallow trench isolation (STI) structures 10011 may be formed in the first semiconductor substrate 1001. First-type transistors 101 may be formed in the first semiconductor substrate 1001, and lateral sides of the first-type transistors 101 may be insulated by the STI structures 10011.

The first semiconductor substrate 1001 may be a silicon (Si) substrate or a glass substrate. The second semiconductor substrate 1003 may be a monocrystalline substrate or a polycrystalline silicon substrate. The embedded insulating layer 1002 may be an oxide layer or may be a layer made of one or more other suitable materials.

Given the presence of the buried insulating layer 1002, the composite semiconductor substrate 100 may be a silicon-on-insulator (SOI) substrate.

In an embodiment, a method for manufacturing the composite semiconductor substrate 100 may include providing a first semiconductor member. The method may further include oxidizing a surface (e.g., an upper surface) of the first semiconductor member to form an embedded insulating layer 1002 on a first semiconductor substrate 1001. The oxide layer resulted from the oxidization is the embedded oxide insulating layer 1002. The portion of the first semiconductor member that is not oxidized is the first semiconductor substrate 1001. The method may further include attaching the second semiconductor substrate 1003 to the embedded insulating layer 1002 to form a composite structure or the composite semiconductor substrate 100. In an embodiment, the method may include cutting the composite structure to obtain the composite semiconductor substrate 100.

In an embodiment, when STI structures 10011 are formed, other isolation structures (e.g., deep trench isolation structures) may also be formed. When first-type transistors 101 are formed, second-type transistors 201, third-type transistors 301, and/or other components may also be formed.

In an embodiment, a method for forming first-type transistors 101 may include the following steps: using a first ion implantation process to implant first-type dopants through a first surface of the first semiconductor substrate 1001; forming first-type gates (for the first-type transistors 101) on the first surface of the first semiconductor substrate 1001; using a second ion implantation process to implant second-type dopants through the first surface of the first semiconductor substrate 1001; heat-treating the composite semiconductor substrate 100 (mainly heat-treating the first semiconductor substrate 1001) to activate the implanted first-type dopants and the second-type dopants for forming sources, drains, active regions, and/or STI structures.

Figure 2B:
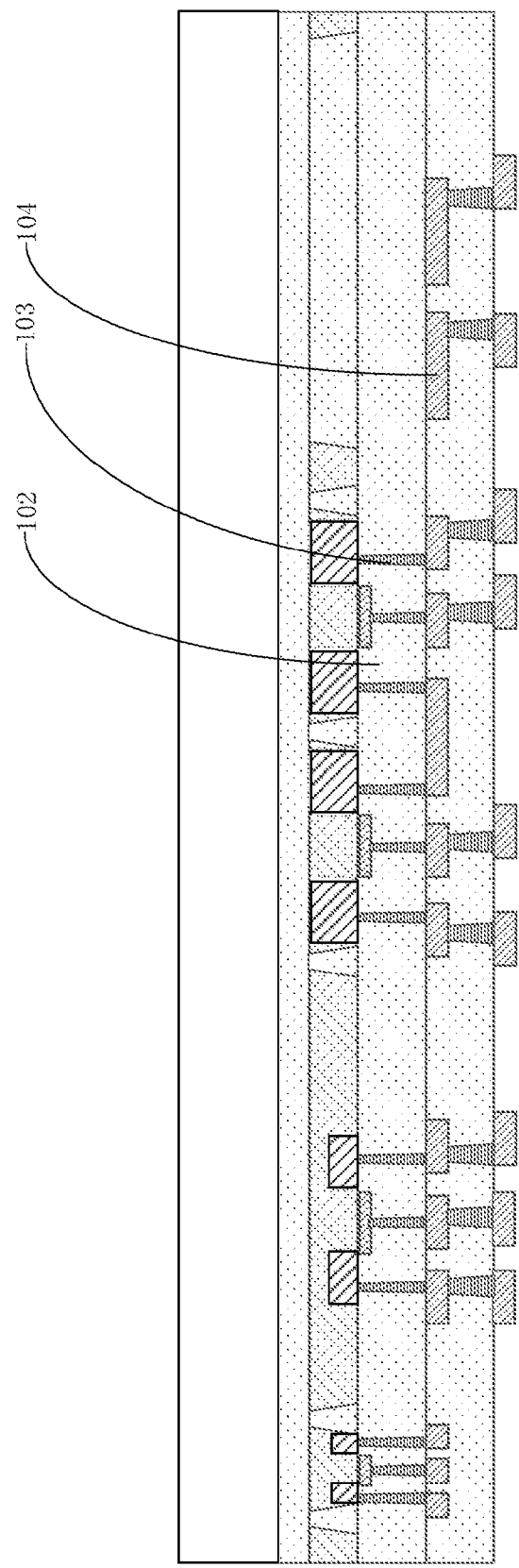

Referring to FIG. 2B, a first dielectric layer 102 that covers the first surface of the semiconductor substrate 1001 may be formed. The first dielectric layer 102 may cover the first-type transistors 101. First-type vertical connectors 103 (for connecting source, drain, and gate of the first-type-transistors 101 to other components of the semiconductor device) may be formed in the first dielectric layer 102. The first-type vertical connectors may be formed of at least one of a semiconductor material (which may include silicon) and tungsten. First-type horizontal connectors 104 may be formed on a first surface of the first dielectric layer 102 and may be connected to first-type vertical connectors 103. As illustrated in FIG. 2B, further vertical connectors and/or horizontal connectors may be formed and may be connected to first-type vertical connectors 103 and/or first-type horizontal connectors 104.

Figure 2C:
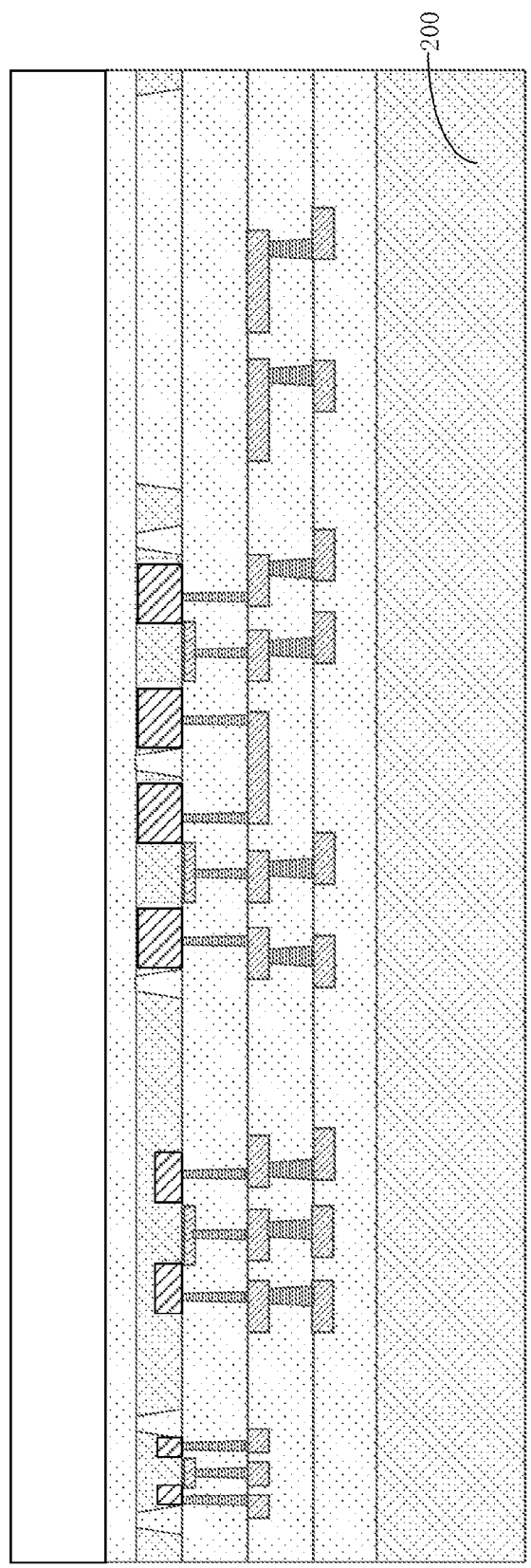

Referring to FIG. 2C, the structure illustrated in FIG. 2B (including the first substrate 1001, the first dielectric layer 102, the first-type transistors 101, the connectors, etc.) may be attached to a carrier substrate 200. In an embodiment, the carrier substrate 200 may be joined with the first dielectric layer 102 by an adhesive layer.

The supporting substrate 200 may be a semiconductor substrate and may be configured for carrying and supporting the first semiconductor substrate 1001. The carrier substrate 200 may be removed or retained in one or more subsequent process steps. In an embodiment, the carrier substrate 200 may be retained and may be part of an integrated circuit package in a subsequent packaging process. Advantageously, material and cost associated with the packaging process may be minimized.

Figure 2D:
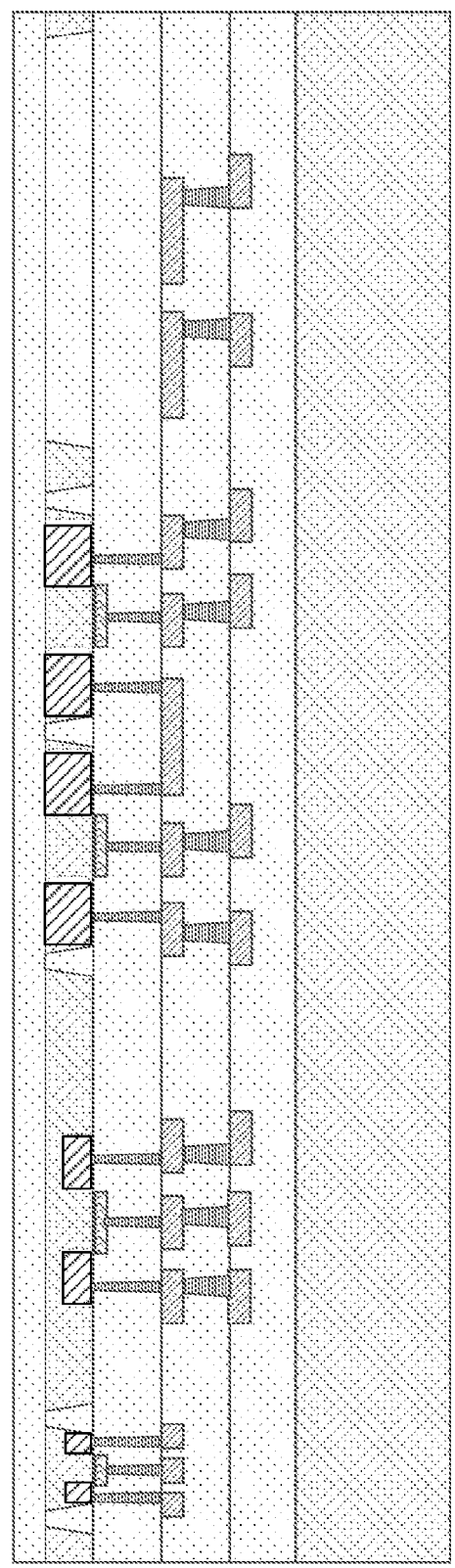

Referring to FIG. 2D, the second semiconductor substrate 1003 may be removed from the embedded insulating layer 1002 and/or from a second surface (opposite the first surface) of the first semiconductor substrate 1001. The second semiconductor substrate 1003 may be removed through chemical mechanical polishing (CMP) and/or etching. In an embodiment, the embedded insulating layer 1002 may also be removed.

Figure 2E:
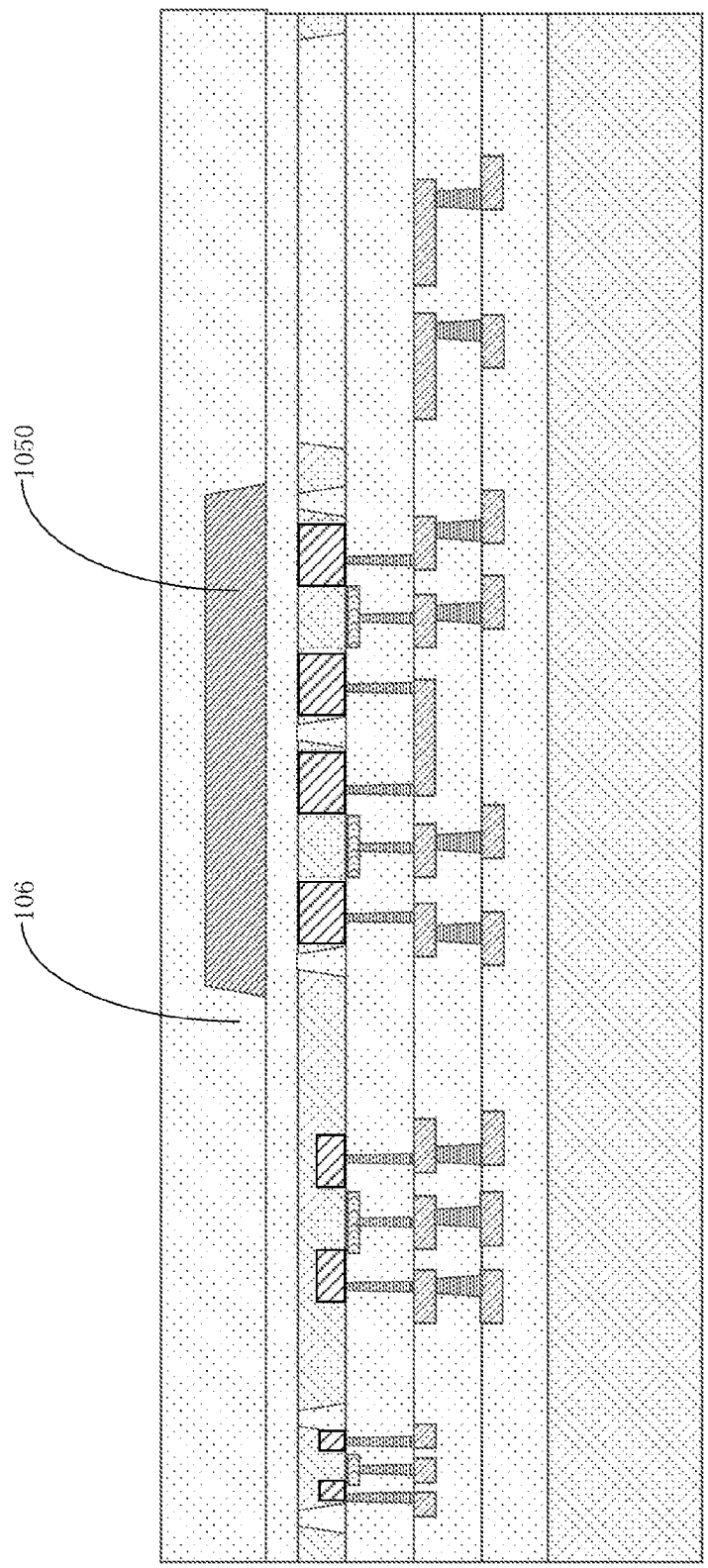

Referring to FIG. 2E, an island-shaped sacrificial layer 1050 may be formed on the embedded insulating layer 1002 and/or the first semiconductor substrate 1001 and may partially cover the embedded insulating layer 1002 and/or the first semiconductor substrate 1001. A first surface of the island-shaped sacrificial layer 1050 may directly contact the embedded insulating layer 1002 and/or the first semiconductor substrate 1001. The sacrificial layer 1050 may substantially and/or completely cover (the bottoms of) the first-type transistors 101. A second dielectric layer 106 may be formed to substantially and/or completely cover a second surface (opposite the first surface) and lateral surfaces of the sacrificial layer 1050. A first portion of the second dielectric layer 106 may directly contact the second surface of the sacrificial layer 1050. A second portion of the second dielectric layer 106 may be securely attached to the embedded insulating layer 1002 and/or the first semiconductor substrate 1001. The first portion of the second dielectric layer 106 may be thinner than the second portion of the second dielectric layer 106.

Figure 2F:
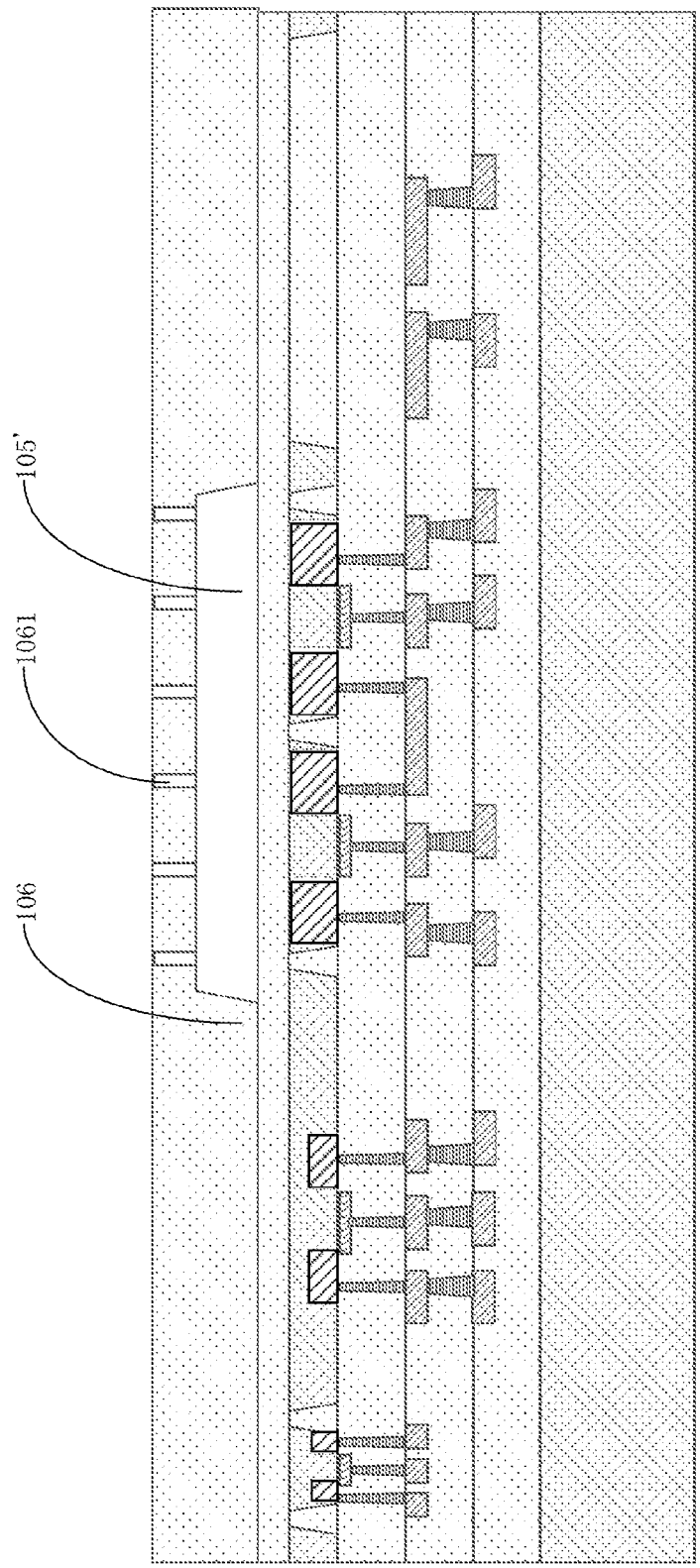

Referring to FIG. 2F, micro-channels 1061 may be formed through the first portion of the second dielectric layer 106 and may reach (the second surface of) the sacrificial layer 1050. The micro-channels 1061 may be formed through etching the second dielectric layer 106. The material of the sacrificial layer 1050 may be released and/or removed (e.g., through wet etching and/or one or more other methods) through the micro-channels 1061, such that a cavity 105' may be formed where the sacrificial layer 1050 was.

Figure 2G:
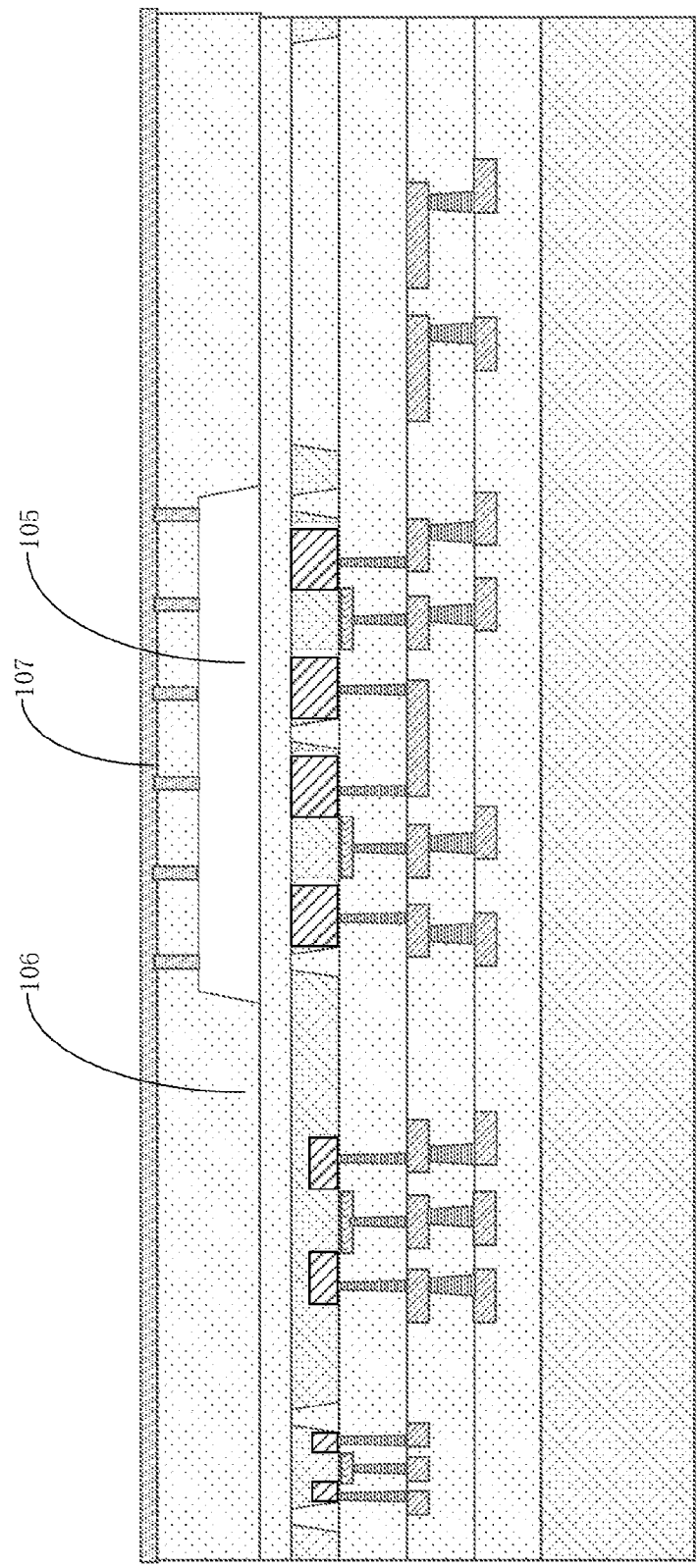

Referring to FIG. 2G, a third dielectric layer 107 may be formed on the second dielectric layer 106 to seal the micro-channels 1061 is 107, such that the cavity 105' may be closed to form a closed cavity 105. Some material of the third dielectric layer 107 may fill the micro-channels 1061. The closed cavity 105 may effective enhance insulation between first-type transistors 101, such that unwanted substrate coupling effects (which may affect performance of first-type transistors 101) may be prevented or substantially minimized.

Figure 2H:
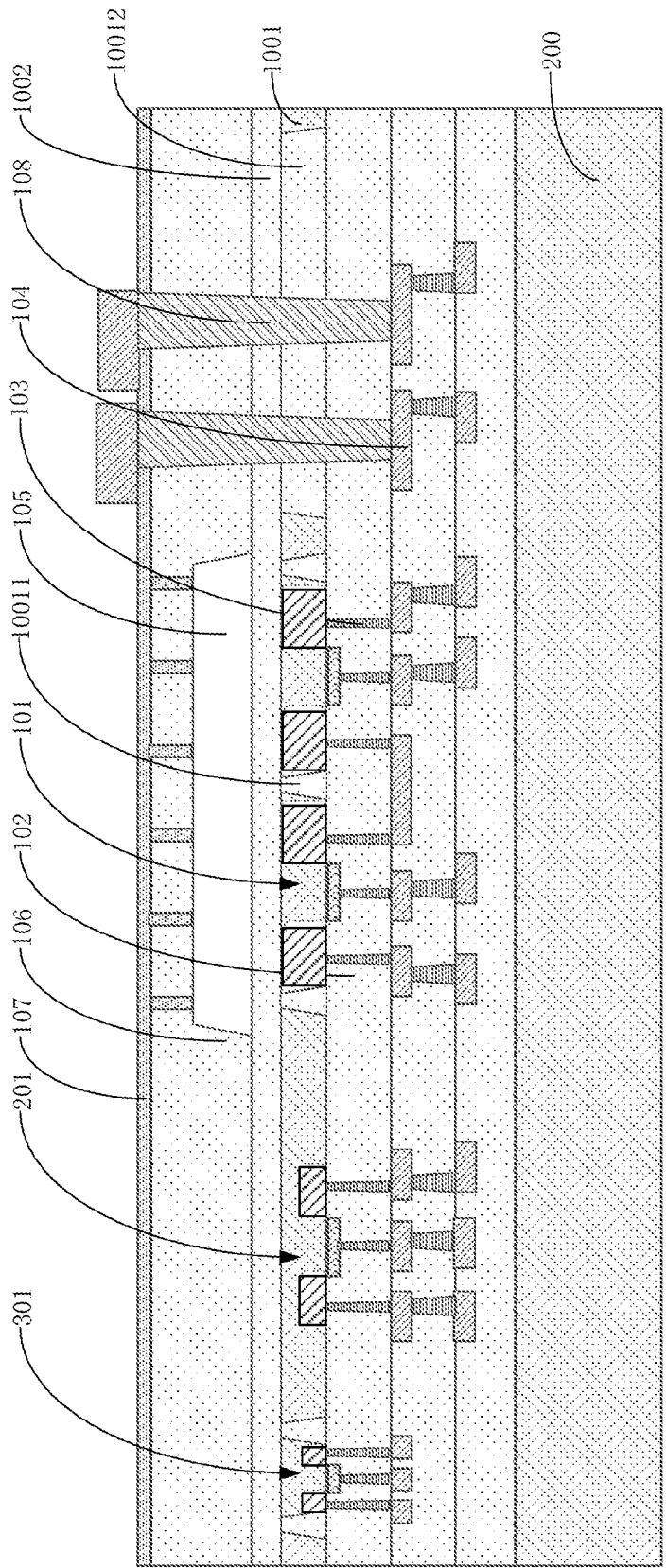

Referring to FIG. 2H, second-type vertical connectors 108 may be formed and may pass through the third dielectric layer 107, the second dielectric layer 106, the embedded insulating layer 1002, the first semiconductor layer 1001, and the first dielectric layer 102. The second-type vertical interconnects 108 may be connected to first-type horizontal connectors 104.

In an embodiment, before the formation of the second-type vertical connectors 108, e.g., when STI structures 10011 are formed, horizontal STI structure 10012 may be formed in the first semiconductor substrate 1001 at one or more potential locations where the second-type vertical connectors 108 are to be formed. As a result, lateral sides the second-type vertical connectors 108 may be surrounded and insulated by the first dielectric layer 102, the horizontal STI structure 10012 in the first semiconductor substrate 1001, the second dielectric layer 106, and the third dielectric layer 107. The second-type vertical connectors 108 may be formed of one or more of a semiconductor material (which may include silicon), tungsten, and copper.

The semiconductor device may include one or more other components, such as other transistors, a MEMS device, and/or an IPD. The other components may be formed in one or more steps discussed above and/or one or more other process steps.

The semiconductor device may represent a radio-frequency (RF) switch device. In an embodiment, the semiconductor device may be an RF front-end module (FEM) that includes an RF switch device, and the first-type transistors 101 may represent transistors in the RF switch.

According to embodiments of the invention, the STI structures 10011 may effectively insulate (lateral sides of) the first-type transistors 101 from each other. The first dielectric layer 102 may effectively insulate a first side of each first-type transistor 101. The closed cavity 105 may effectively insulate a second side (opposite the first side) of each first-type transistor 101. Therefore, each first-type transistor 101 may be effectively insulated, such that substrate coupling effects may be minimized or substantially prevented. As a result, signal loss and/or distortion may be minimized or substantially prevented. Advantageously, the quality and/or performance of the semiconductor device may be satisfactory.

FIG. 3 shows a flowchart illustrating a method for manufacturing a semiconductor device in accordance an embodiment of the present invention.

In step S101, a composite semiconductor substrate may be provided. The composite semiconductor substrate may include a first semiconductor substrate, an embedded insulating layer disposed on the first semiconductor substrate, and a second semiconductor substrate disposed on the embedded insulating layer. STI structures and first-type transistors may be formed in the first semiconductor substrate. Lateral sides of the first-type transistors may be insulated by the STI structures.

In step S102, a first dielectric layer may be formed and may cover a first surface of the first semiconductor substrate. First-type vertical connectors may be formed in the first dielectric layer and may be connected to the sources, drains, gates of the first-type transistors. First-type horizontal connectors may be formed on a first surface of the first dielectric layer and may be connected to the first-type vertical connectors.

In step S103, the first dielectric layer and/or the first semiconductor substrate may be joined with a carrier substrate. The second semiconductor substrate may be removed.

In step S104, an island-shaped sacrificial layer may be formed on a second surface of the first semiconductor substrate. A first surface of the sacrificial layer may contact the first semiconductor substrate. A second dielectric layer may be formed and may cover the sacrificial layer. A portion of the second dielectric layer may contact a second surface of the sacrificial layer.

In step 105, micro-channels may be formed to penetrate the portion of the second dielectric layer. Material of the sacrificial layer may be removed through the micro-channels, such that a cavity may be formed. A third dielectric layer may be formed on the second dielectric layer to seal the micro-channels, such that the cavity may be closed to form a closed cavity.

In step 106, second-type vertical connectors may be formed. The second-type vertical connectors may pass through the third dielectric layer, the second dielectric layer, the embedded insulating layer, the first semiconductor substrate, and the first dielectric layer. The second-type vertical connectors may be connected to the first-type horizontal connectors.

An embodiment of the invention may be an electronic device or a module of an electronic device that includes a semiconductor device discussed with reference to FIG. 1 and/or includes a semiconductor device manufactured using the method discussed with reference to FIGS. 2A to 2H. Unwanted parasitic capacitance (potentially resulted from substrate coupling effects) may be prevented or substantially minimized in the semiconductor device. Advantageously, quality and performance of the electronic device may be optimized. For example, the electronic device may represent a mobile phone, a tablet computer, a notebook computer, a netbook, a video game console, a television, a VCD player, a DVD player, a GPS navigator, a camera, a camcorder, an audio recorder, an MP3 player, an MP4 player, or a portable game device. As another example, the electronic device may be mainboard of a mobile phone.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A semiconductor device comprising:
   a first dielectric layer;
   a second dielectric layer overlapping the first dielectric layer and having a closed cavity structure;
   a first transistor disposed between the first dielectric layer and the closed cavity structure;
   a second transistor disposed between the first dielectric layer and the closed cavity structure;
   a trench isolation structure disposed between the first transistor and the second transistor and disposed between the first dielectric layer and the closed cavity structure; and
   an embedded insulating layer disposed between the first transistor and the closed cavity structure.

2. The semiconductor device of claim 1, wherein a space inside the closed cavity structure is substantially vacuum.

3. The semiconductor device of claim 1, further comprising: a gas disposed inside the closed cavity structure.

4. The semiconductor device of claim 1, further comprising: a semiconductor substrate disposed between the first dielectric layer and the second dielectric layer, wherein the trench isolation structure and at least one of a source and a drain of the first transistor are disposed in the semiconductor substrate.

5. The semiconductor device of claim 4, wherein the semiconductor substrate is a monocrystalline silicon substrate.

6. The semiconductor device of claim 1, wherein the first transistor is at least one of a metal-oxide-semiconductor field-effect transistor and a depletion-mode transistor.

7. The semiconductor device of claim 1, wherein a gate of the first transistor and a gate of the second transistor are embedded in the first dielectric layer.

8. The semiconductor device of claim 1, further comprising: a first connector extending in a first direction and being electrically connected to at least one of a source, a drain, and a gate of the first transistor; a second connector extending substantially parallel to the first connector and passing through the first dielectric layer and the second dielectric layer; and a third connector electrically extending in a second direction different from the first direction and being connected to both the first connector and the second connector.

9. The semiconductor device of claim 8, further comprising: a semiconductor substrate disposed between the first dielectric layer and the second dielectric layer; and a trench dielectric element disposed the semiconductor substrate, wherein the trench isolation structure, a portion of the first transistor, and a portion of the second transistor are disposed in the semiconductor substrate, and wherein the second connector is surrounded by the trench dielectric element.

10. The semiconductor device of claim 8, wherein at least one of the first connector and the second connector is formed of at least one of tungsten, copper, and a semiconductor that includes silicon.

11. A semiconductor device comprising:
    a first dielectric layer;
    a second dielectric layer overlapping the first dielectric layer and having a closed cavity structure;
    a first transistor disposed between the first dielectric layer and the closed cavity structure;
    a second transistor disposed between the first dielectric layer and the closed cavity structure;
    a trench isolation structure disposed between the first transistor and the second transistor and disposed between the first dielectric layer and the closed cavity structure; and
    a dielectric member formed of a first dielectric material, wherein the second dielectric layer includes a channel structure, and wherein the dielectric member is disposed inside the channel structure.

12. The semiconductor device of claim 11, wherein the second dielectric layer is formed of the first dielectric material.

13. The semiconductor device of claim 11, wherein the second dielectric layer is formed of a second dielectric material different from the first dielectric material.

14. The semiconductor device of claim 11, further comprising: a third dielectric layer disposed on the second dielectric layer, wherein the dielectric member is disposed between the third dielectric layer and the closed cavity structure.

15. The semiconductor device of claim 14, wherein the third dielectric layer is formed of the first dielectric material.

16. An electronic device comprising:
    an electronic component; and
    a semiconductor device electrically connected to the electronic component, wherein the semiconductor device comprises:
    a first dielectric layer;
    a second dielectric layer overlapping the first dielectric layer and having a closed cavity structure;
    a first transistor disposed between the first dielectric layer and the closed cavity structure;
    a second transistor disposed between the first dielectric layer and the closed cavity structure;
    a trench isolation structure disposed between the first transistor and the second transistor and disposed between the first dielectric layer and the closed cavity structure; and
    an embedded insulating layer disposed between the first transistor and the closed cavity structure.

* * * * *